United States Patent
Li (10) Patent No.: US 7,405,629 B2
(45) Date of Patent: *Jul. 29, 2008

(54) FREQUENCY MODULATOR, CIRCUIT, AND METHOD THAT USES MULTIPLE VECTOR ACCUMULATION TO ACHIEVE FRACTIONAL-N FREQUENCY SYNTHESIS

(75) Inventor: Shuliang Li, Lynnwood, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 113 days.

This patent is subject to a terminal disclaimer.

(21) Appl. No.: 11/172,691

(22) Filed: Jun. 30, 2005

(65) Prior Publication Data

US 2007/0001776 A1  Jan. 4, 2007

(51) Int. Cl.
*H03M 3/02* (2006.01)
(52) U.S. Cl. .......................... 331/16; 327/157; 341/143
(58) Field of Classification Search ................... 331/16; 327/157; 341/143
See application file for complete search history.

(56) References Cited

U.S. PATENT DOCUMENTS

| | | | |
|---|---|---|---|
| 5,021,754 A | 6/1991 | Shepherd et al. | |
| 5,055,802 A | 10/1991 | Hietala et al. | |
| 6,779,010 B2 * | 8/2004 | Humphreys et al. | 708/490 |
| 7,119,630 B1 * | 10/2006 | Li | 332/112 |
| 7,126,436 B1 * | 10/2006 | Li | 332/127 |
| 7,127,225 B2 * | 10/2006 | Jaehne et al. | 455/260 |
| 2003/0058055 A1 | 3/2003 | Sridharan | |
| 2005/0017887 A1 | 1/2005 | Nagaso et al. | |

FOREIGN PATENT DOCUMENTS

| | | |
|---|---|---|
| EP | 1345375 | 9/2003 |
| WO | 99/14859 | 3/1999 |

OTHER PUBLICATIONS

International Search Report, PCT/US2006/024746, mailed Oct. 12, 2006.

* cited by examiner

*Primary Examiner*—Robert J. Pascal
*Assistant Examiner*—James E Goodley
(74) *Attorney, Agent, or Firm*—Kevin L. Daffer; Daffer McDaniel, LLP (57) ABSTRACT

A frequency synthesizer is provided having a fractional-N control circuit and method. The control circuit can operate as having a modulator that selectively applies any fractional ratio to a frequency divider within, for example, a feedback loop of a PLL. The modulator can be a delta-sigma modulator or any sequential state machine that can be implemented as the control circuit, and can select amongst a plurality of vector values. The vector values can be spaced relatively close to each other, and the incoming present vector values can each be added to a value chosen from the immediately preceding set of potential values. The selector circuit chooses from among the present set of vector values depending on whether the sum is nearest a target value. The sum nearest the target value is, therefore, selected as the present vector value, and the process is repeated in time for each vector value having a corresponding P value to form a pattern of P values sent to the divider of the PLL. The incoming frequency can therefore be synthesized based on the modulated P values used by the feedback divider to produce the appropriate fractional-N divide ratio for the synthesized frequency.

18 Claims, 7 Drawing Sheets

FREQUENCY MODULATOR, CIRCUIT, AND METHOD THAT USES MULTIPLE VECTOR ACCUMULATION TO ACHIEVE FRACTIONAL-N FREQUENCY SYNTHESIS

BACKGROUND OF THE INVENTION

1. Field of the Invention

The present invention relates to an electronic system and, more particularly, to a frequency modulator that can synthesize fractional-N frequency output using multiple vectors chosen to lower output jitter and increase selectivity and resolution of the fractional output.

2. Description of the Related Art

The following descriptions and examples are not admitted to be prior art or conventional by virtue of their inclusion within this section.

Within nearly every electronic subsystem is some form of generator that produces cyclical waveforms. The waveform generator is oftentimes referred to as an oscillator. Oscillators can be rated depending on their stability and accuracy, frequency adjustability (i.e., tunability), and power consumption. The output from an oscillator is referred to as the reference frequency Fx. This reference frequency can thereafter be tuned using, for example, a phase-locked loop (PLL). Usually $F_X$ is too high so the incoming signal is usually first divided down Q times by a reference frequency divider and becomes the reference frequency $F_R$ for the phase frequency detector (PFD). Thus, $F_R=F_X/Q$. The PLL then employs a divider within its feedback loop to selectively increase the PFD's reference frequency $F_R$. The resonator output frequency can be tuned using what will henceforth be referred to as a "frequency synthesizer."

There are numerous ways in which to design a frequency synthesizer using a PLL. For example, the divider within the feedback loop of the PLL can be modified in integer increments. Thus, output from the frequency synthesizer will be in integer-N multiples of the reference frequency $F_R$. In a traditional PLL implementation, the output will be represented as the voltage-controlled oscillator output, and will transition at a frequency of $F_{VCO}$. Thus, $F_{VCO}=N*F_R=N/Q*F_X$. An unfortunate aspect of integer-N frequency dividers is that the selectable discrete frequencies of $F_{VCO}$ is dependent on the value of N. The frequency spacing, oftentimes referred to as the minimum frequency resolution, or minimum channel spacing, using an integer-N divider can, in some instances, be too high for an intended application. Another issue is that for some applications, the integer N must be very large, and results in high phase noise.

Given that frequency synthesizers are used in a wide variety of applications, including FM radios, radar systems, cellular and PCS telephone systems, test equipment such as spectrum analyzers and signal generators, it would be desirable to implement a frequency synthesizer having a smaller minimum channel spacing. In order to achieve a smaller minimum channel spacing, fractional-N dividers are needed. In addition to achieving smaller channel spacing, fractional-N dividers allow small divide values to achieve the same channel spacing, which reduces the phase noise.

A fractional-N divider within the feedback loop can produce a synthesizer output of $F_{VCO}=F_R(N+n/d)$. Thus, in addition to the integer divide factor N, a fractional-N divider will introduce fractions between integers set by a numerator value (n) divided by a denominator value (d). For example, when d=8, n may be an integer from 0 to 7. This example will increase the integer PLL resolution by a factor of 8 by adding 7 divide values between N and N+1. Thus the channel spacing is ⅛ of an integer PLL.

A fractional-N divider usually comprises a fractional-N control logic circuit and an integer-N divider. The divide value of the integer-N divider is switched between two integer values in a manner set by the fractional-N control logic circuit. Thus the average divide value is a fractional number. The way a fractional-N divider works causes signal spurs that are not usually seen on an integer divider, because each time the divide value changes, the PLL makes an abrupt phase correction. To minimize the spurs, the sequence of divide value should be carefully selected. One approach is delta-sigma modulation. To meet even higher performance requirement, compensation circuits should be used to cancel the signal spurs.

Therefore, a fractional-N divider is one that divides the reference frequency by a mixed number containing a fraction in order to achieve a synthesized frequency at the output of the PLL. A pattern of values are fed to the divider, and that pattern represents a modulated output. The output is typically modulated around two values. For example, if the fractional-N divider is 50.125, then the majority of the sequential pattern will be of 50 value with a periodic 51 value interspersed within the pattern. The number of 50 values to the number of 51 values is quite large. Using this example, a 51 value appears rarely in relation to 50 values within the modulated string or sequence of values. A low frequency spur may therefore arise, and cannot be easily removed by the low-pass filter of the PLL. This low frequency occurrence within the modulated output will produce substantial jitter in the pass band of the synthesized frequency.

It would be desirable to introduce a modulator and frequency synthesizer circuit that avoids low frequency jitter by giving greater selectivity to the modulated pattern input to the PLL divider. A lower jitter-producing pattern may be one that can beneficially achieve higher resolution for the average divide value, as well as providing an average divide value that can be substantially near an integer value. An improved modulator output is thereby one that can achieve high resolution changes in the average divide value, yet more often (and with higher frequency) modulate changes at that output. The higher frequency changes are more effectively removed by the low-pass filter of the PLL.

SUMMARY OF THE INVENTION

The problems outlined above are in large part solved by an improved modulator circuit. The modulator circuit produces a sequential pattern of values that is modulated about an average value. The sequential pattern can then be used by a divider within a PLL. The combination of modulator and PLL, having a divider that receives the modulator output, forms the synthesizer circuit. The modulator output is produced by choosing a vector from possibly three or more vectors according to a summation between each of a present set of vectors and the previously chosen vector. The summation value that is nearest a target value will be chosen. The sequence of chosen vectors is used to select an offset ($P_{OFF}$) value from among a plurality of offset values corresponding to the vector chosen. The offset value added to the base value forms a pattern of P values. The pattern of P values are then sent to the divider. Operating as an integer divider, the divide-by value is changed each time the P value changes to effectively produce a fractional-N divide amount. The fractional-N divide amount achieved by the integer divider is essentially the average P value within the sequence of P values. Armed with the average P value and the corresponding fractional-N divide output, the divider modifies the synthesized frequency based on a divide of the reference frequency. The synthesized frequency has lower jitter if the sequence of P values is optimally chosen so that changes in the P values occur more often, even though the fractional value might be extremely close to an integer value.

The modulator is preferably a delta-sigma modulator. The modulator utilizes an accumulator that integrates combinations of present vectors with the previously chosen vector. A value/vector selector will then choose the present vector having the best error value (i.e., the error value closest to a target value). In most instances, the target value is a 0 value, or nearest the 0 value but possibly of opposite sign than the previous vector value. Of course, there may be numerous other target values, and the selector will choose a vector based on which vector, when combined with the previous vector, demonstrates a value closest to the target value.

According to one embodiment, the modulator includes a plurality of adders coupled to sum a present set of potential values with one value chosen from an immediately preceding set of potential values within the sequential pattern of values. A selector logic is used for selecting one of the present set of potential values if the sum is nearest 0 in value, or if the sum is nearest 0 in value but is of opposite sign than the value chosen from the preceding set of potential values.

A multiplexer can be used, for example, to receive from the selector logic a selection signal upon a selector input of the multiplexer. The selection signal can be used to select in sequence the sequential pattern of values or $P_{OFF}$ values within the P pattern fed to the divider of the PLL. Another multiplexer can be used to periodically forward instructions to the selector logic. This multiplexer can thereby select the sum nearest 0 in value but of opposite sign than the value chosen from the preceding set of potential values. If the sum nearest 0 in value but of opposite sign than the previous value is not chosen, then the multiplexer will, possibly by default, select the sum nearest 0 regardless of the sign of the previous value chosen. Of course, selection between the nearest value and opposite sign or simply the nearest value can be carried out by other mechanisms beyond a multiplexer. Regardless of the mechanism chosen, the selection process can occur either in random order within the sequence or at regular intervals. It is of benefit that the selection between simply the nearest zero value and the nearest zero value but of opposite sign occur periodically in order to generate a higher frequency value change in the P pattern.

According to an alternative embodiment, a synthesizer circuit is provided. The synthesizer circuit produces a signal of selectable frequency and comprises a modulator and a PLL. The PLL includes a divider that fractionally divides a frequency of the signal based on a plurality of integer values extending as positive and negative vector values from an average value equal to a fraction by which the divider divides the frequency of the signal. Thus, the vector values extend from the average value to an integer value in a particular direction (either positive or negative). Of import is the integer values that extend as vectors are more than two, thus, allowing the sequence of P values to be three or more. As the number of values within the sequence varies by more than two (and also possibly more than three), the modulated pattern will produce less jitter since changes in vector values occur more often. The greater the number of vector value changes, the more often will be the change. This is certainly true for average P values that are near integer values since they would be represented as mostly a one value, and then the other value sparsely populated within the pattern. By modulating between three or more values, changes in P values occur more often and jitter is substantially reduced.

According to yet another embodiment, a method is provided by modifying a frequency of a signal. The method includes selecting a vector from among a plurality of vectors (preferably three or more) having a sum when added with a previous vector within a sequence of vectors that is near a target value. The selection process is repeated for selecting each vector within a sequence of vectors. Using the sequence of vectors, a divider value is modulated within a PLL to modify a frequency of the signal applied to the PLL.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Figure 1:
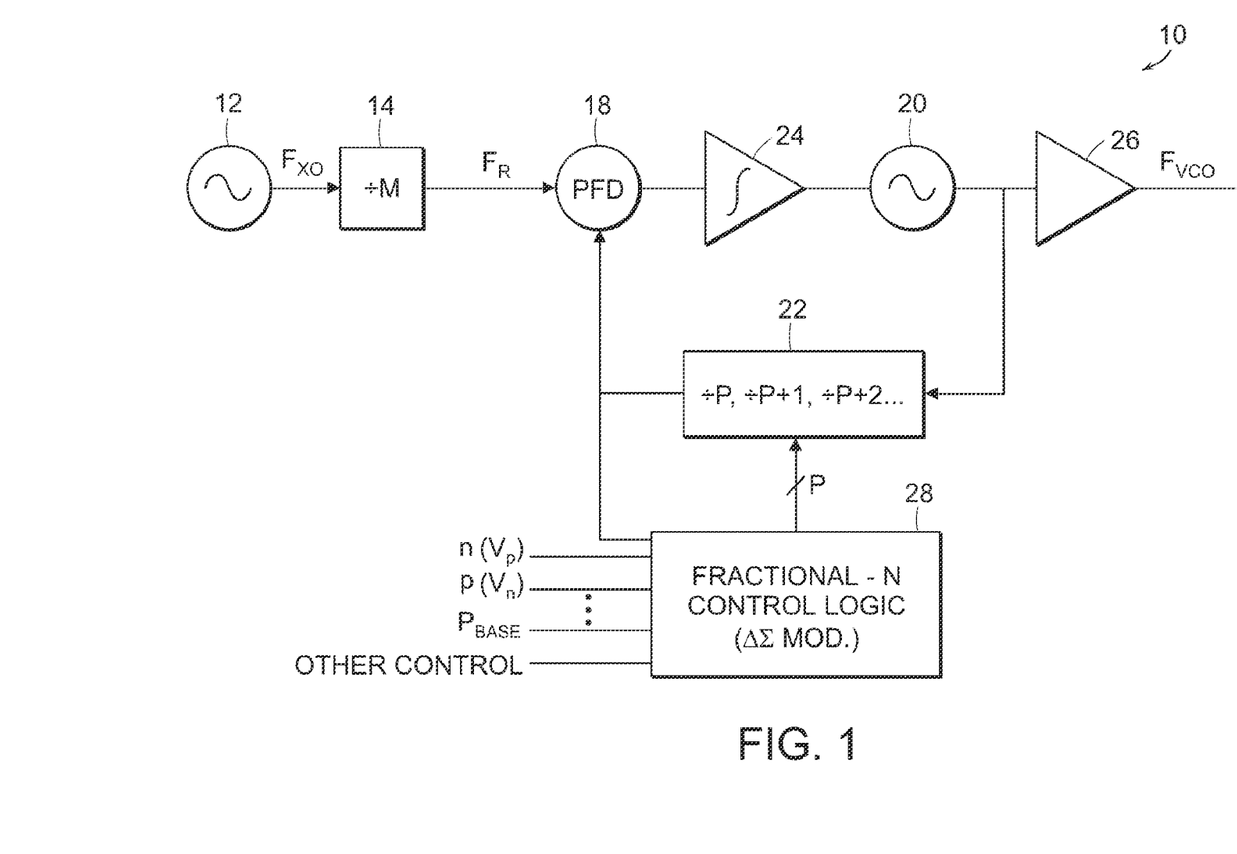
FIG. 1 is a block diagram of a frequency synthesizer with a fractional-N feedback divider that comprises a fractional-N control logic block and an integer-N divider.

Turning now to the drawings, FIG. 1 is a block diagram of a frequency synthesizer 10 according to one form. Frequency synthesizer 10 contemplates the generation of multiple signal frequencies, all derived from a common reference or time base. The time base may be provided from a crystal oscillator 12. Crystal oscillator 12 includes any form of resonator such as, for example, quartz. The piezoelectric material, such as quartz, produces a piezoelectric effect that can be amplified, wherein the quartz operates as a feedback of low impedance at a particular resonant frequency.

Depending on how the quartz is formed or the crystal is cut, the resonant frequency can change. Typically, however, the resonant frequency is fixed for that particular resonator, with slight modifications to the output frequency available through trimming capacitors and the like. The output from the crystal oscillator thereby produces an alternating voltage or current at the resonant frequency $F_X$ as shown. The output frequency can be divided down using an integer divider 14 at the output of oscillator 12.

Many crystal oscillators can be temperature compensated. It is generally well known that piezoelectric resonators shift slightly in frequency as the operating temperature changes. In order to compensate for the frequency shift, temperature readings can be taken from the resonator and the output from the crystal oscillator may be shifted to offset the temperature skew. The resulting output is, therefore, a temperature-compensated crystal oscillator 12 or TCXO.

A dominant frequency synthesizer used in the wireless communication industry and test equipment (spectrum analyzers and signal generators) employ phase-locked loops (PLLs). Shown in FIG. 1 are four components of a PLL. Beginning with a phase-frequency detector (PFD) 18, a reference frequency FR is compared with a feedback frequency $F_{VCO}/(N+n/d)$. PFD 18 generates an error signal based on the phase or frequency differences between the reference frequency and the feedback frequency. As shown, the feedback frequency is a divided-down frequency from a voltage-controlled oscillator (VCO) 20. While oscillator 20 produces $F_{VCO}$ proportional to a voltage applied thereon, divider 22 divides $F_{VCO}$ a fractional amount.

PFD 18 can be formed from, for example, a set of D-type flip-flops or, if phase error is all that is required, a set of exclusive OR gates. The phase and/or frequency error output from PFD 18 can then be placed into, for example, a filter such as a low pass filter. In addition to the filter, a charge pump can be used to charge up a voltage based on, for example, the feedback frequency lagging the reference frequency. The combination of low pass filter and charge pump is shown as reference numeral 24. VCO 20 generates the output signal from frequency synthesizer 10. Depending on the drive requirements, a buffer 26 may be needed. VCO 20 can be achieved using a positive feedback amplifier. As noted above, oscillations occur at the resonant frequency and the oscillations can be tuned via a control voltage that is applied across a varactor, for example, in the tank circuit.

The frequency of the output signal from synthesizer 10 ($F_{VCO}$) can be tuned by changing the feedback divide value within divider 22. Divider 22 thereby constitutes a main function of the PLL and is needed to cover a very wide range of continuous divisions for the crystal resonator reference and for the VCO. For high frequency VCOs, dual modulus or multi-modulus dividers are employed. In order to minimize noise characteristics of the PFD 18 operation and to lower the minimum channel spacing, fractional-N dividers have gained in popularity. Fractional-N divider can be formed by a programmable integer-N divider 22 and a fractional-N control logic circuit 28. The fractional-N control logic circuit is clocked by the divider, and dynamically supplies the divider 22 with reload integer value during the locked state. If the supplied values are switched between P and P+1 in the correct proportions, the average divide value can be N+n/d, which is fractional. FIG. 1 indicates that the pattern can be switched between P, P+1, and so forth in correct proportions. Depending on how often P, P+1, P+2, etc. are used in a sequence, the fractional value will change.

Figure 2:
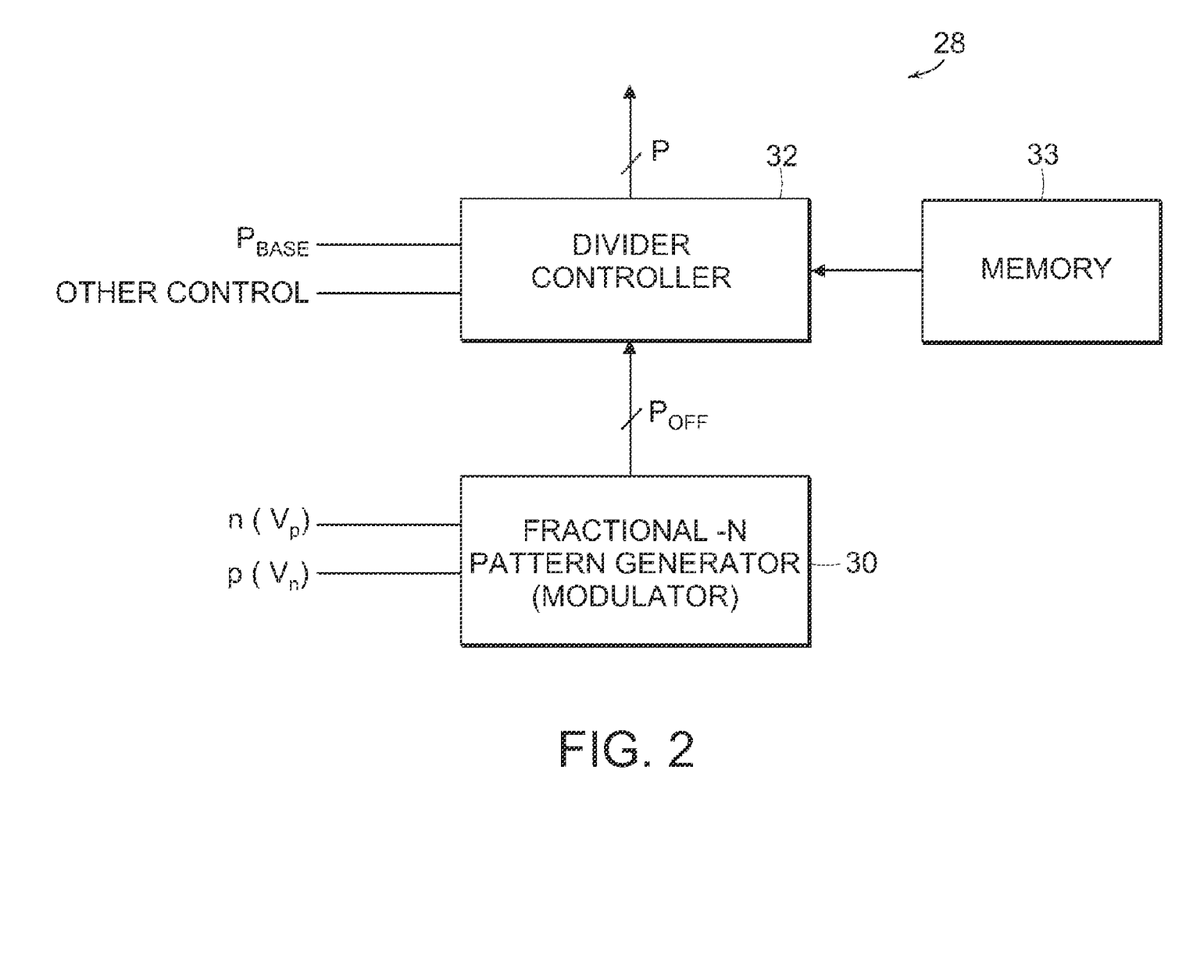
FIG. 2 is a block diagram of a fractional-N control logic block that comprises a fractional-N pattern generator (modulator) and a divider controller.

As shown in FIG. 2, the fractional-N control logic circuit 28 of FIG. 1 comprises a fractional-N pattern generator (modulator) 30 and a divider controller 32. Modulator 30 is clocked by the P divider. Modulator 30 receives fraction information from input ports, in the form of numerator n and denominator d. Alternatively, modulator 30 can receive two vectors $V_p$ and $V_n$, that defines the fraction n/d. It modulates on a control signal $P_{OFF}$, which is often 1-bit wide and indicates whether the integer-N divider should load N or N+1 at each reload operation. At each clock cycle, one bit of the control pattern is presented as $P_{OFF}$. The name $P_{OFF}$ comes from "P divider offset value". However, it may have functions other than the original meaning. $P_{OFF}$ is further processed by a divider controller, which generates an appropriate integer P that is fed into divider 22. For example, $P_{OFF}=0$ indicates N and $P_{OFF}=1$ indicates N+1. If so, the P divide values can be formulated as $P=P_{BASE}+P_{OFF}$, where $P_{BASE}$ is the base value, and $P_{OFF}$ is the offset value. For one example, the divider controller receives $P_{BASE}$ and $P_{OFF}$, and generates the sum P at output. If $P_{BASE}=20$, n=3 and d=8, then the modulator may generate $P_{OFF}$ as 01001001, one bit at each clock, and forming such repeating fractional-N control pattern every d (i.e., 8) cycles. The P value sequence is then 20, 21, 20, 20, 21, 20, 20 and 21, which repeats as the circuit runs. The fractional-N control pattern generated by the modulator has a period of d, and has n 1 s in each period. Similar period also applies to P, and its average value is $P=P_{BASE}+n/d$. Hence, the desired fractional divide value is achieved.

The divider controller can have alternative structures and functionalities. In one embodiment, $P=P_{BASE}+P_{STEP}$ (n/d), where $P_{STEP}$ comes from other control inputs. If $P=20+\frac{1}{32}$, it can be expressed as $P=19+2\times(\frac{33}{64})$, where $P_{STEP}=2$, $P_{BASE}=19$, n=33 and d=64. This makes P switch between 19 and 21 (P and P+2), which is non-consecutive P fractional-N synthesis. If it were synthesized with consecutive P and P+1 (20 and 21), the number of P is just one and the number of P+1 is 31 in one fractional-N modulation cycle. The badly balanced P to P+1 ratio can cause low frequency, high amplitude spurious signal noise at PFD that easily passes through the loop filter to $F_{VCO}$. After using non-consecutive P synthesis, the P and P+2 ratio (33 to 31) is well balanced, and the spurious noise can be reduce in many cases.

Instead of deriving the fractional-N pattern of P, P+1, P+2, etc. from a generator such as a delta-sigma modulator 30, the pattern can be derived alternatively from memory 33. Memory 33 may have the various P values already stored therein, and a fetch engine, possibly within controller 32, sends the sequence of fetch instructions to memory 33. The fetch instructions will produce the appropriate pattern in the appropriate sequence from memory 33 in order to achieve the fractional-N value needed for divider 22 (FIG. 1).

Figure 3:
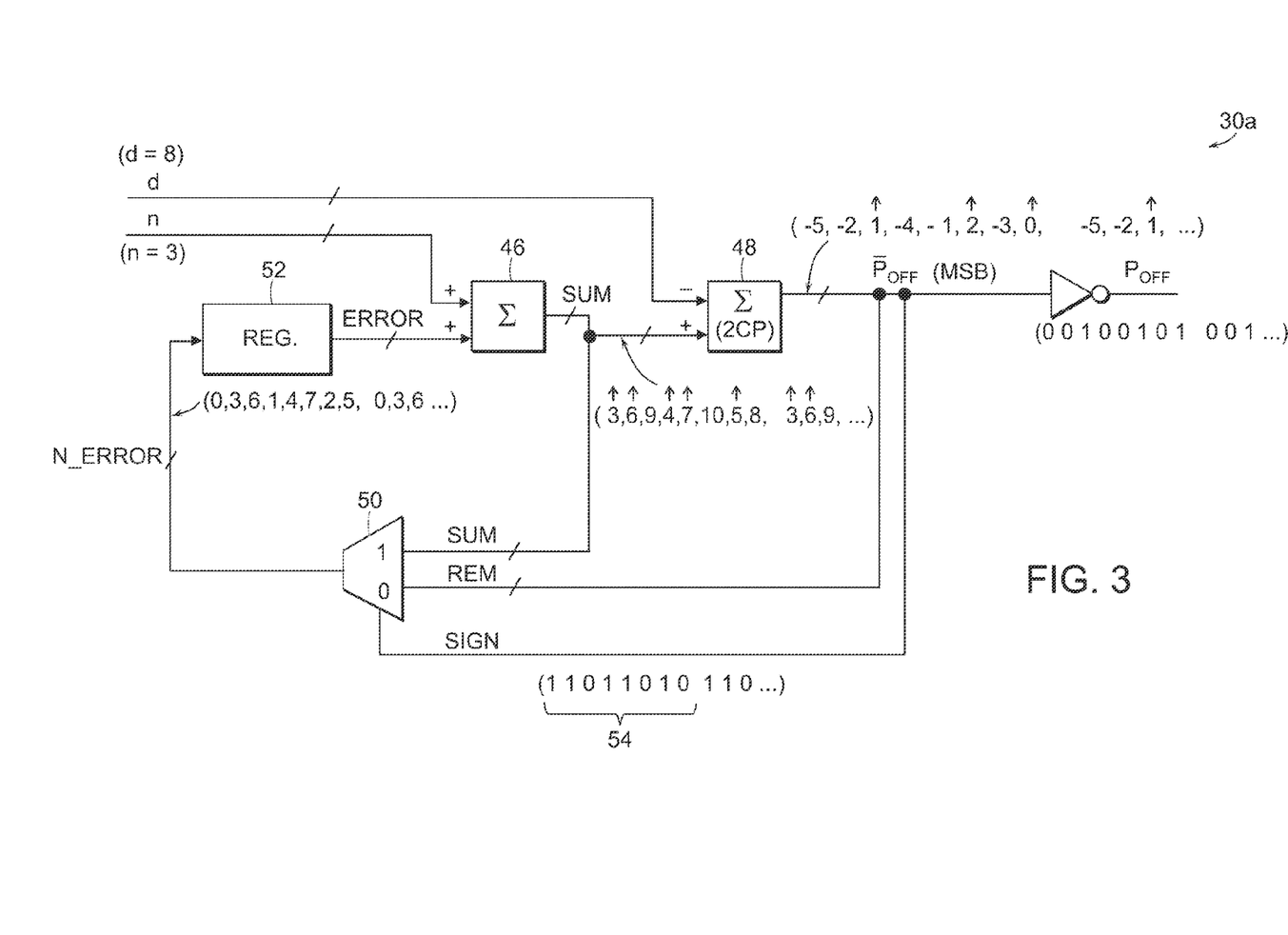
FIG. 3 is a block diagram of the fractional-N pattern generator of FIG. 2, according to one example, where both the numerator and denominator are selectable, and the two possible errors of both delta directions are calculated by two adders in serial.

FIG. 3 illustrates one form of a modulator circuit 30a. Modulator 30a can be used to produce the appropriate pattern or sequence of values ($P_{OFF}$) fed to the divider controller 32 (FIG. 2). As shown, for a numerator (n) equal to 3 and a denominator (d) equal to 8, the $P_{OFF}$ sequence contains a fractional logic 1-to-0 amount. That fraction is equal to ⅜ or 00100101, indicative of three logic 1's to a total of eight possible logic 1's and 0's. Modulator circuit 30a includes one adder and preferably two adders 46 and 48. Adders 46 and 48 will generate two possible future errors of both delta directions. Adder 48 can be formed by inverting all of the bits of the value being subtracted (i.e., the denominator value) and set the least significant bit (LSB) carry in to be binary 1. The full adder operates as a subtractor in two's complement technique subtraction.

The output from the two's complement subtractor (full adder with inverted input and a LSBs carry in) circuit 48 produces a remainder value. The most significant bit (MSB)

output from subtractor 48 constitutes a sign value. The sign value will decide the correct delta direction. If it is 0, then the future error from adder 48 (remainder) is selected by multiplexer 50; otherwise the future error from adder 46 (sum) is selected. The selected future error is forwarded to the register to update error at each proper clock edge. The correct delta direction also forms a delta-sigma modulated control signal $P_{OFF}$.

Shown merely as an example, a string of values can occur beginning with a 0 value output from register 52, with numerator n=3 and denominator d=8. At this ratio, error value output from register 52 will be incremented by 3 for each value in the sequence. The error value from adder 46 is subtracted from the denominator value to produce a remainder value. Whenever the remainder value is a negative number (i.e., denominator is greater than the possible future error value from adder 46), then the sign value will be represented as a logic 1 value. This is due to the nomenclature in which a signed two's complement binary number is represented. Essentially, a negative number in two's complement nomenclature encounters a logic 1 value in the most significant bit position. A positive number encounters a logic 0 value in the most significant bit position. Thus, all negative signed numbers will produce a logic 1 value in the most significant bit, output as a sign value.

The inputs to the sequential circuits of modulator 30a can comprise a clock signal along with the numerator and denominator values. The output signal $P_{OFF}$ is an inverted 1-bit feedback divider offset value in this example, which forms a first order delta-sigma pattern to modulate the PLL frequency. Modulator 30a operates in a first step to store the current error value. In the second step, possible future errors of both delta directions can be calculated. One future error is the sum, which is equal to the current error plus n. Another future error is the remainder, which equals sum minus d. In the third step, the correct delta direction is determined using the most significant bit (MSB) of the remainder value. This bit drives the output $P_{OFF}$ and the select input of the multiplexer 50. In the fourth step, the selected future error replaces the current error in register 52 at a new clock cycle. These steps repeat and the output forms a first order delta-sigma modulated fractional-N control signal forwarded to the feedback divider controller of the frequency synthesizer.

Future errors are arithmetic operation results of current error and two input integers. The integers representing the fraction are in the form of numerator and denominator in modulator 30a, but they can be other arithmetic operation results of numerator, denominator and other quantities if the fraction information is correctly represented. This is illustrated in the following two embodiment 30b.

Figure 4:
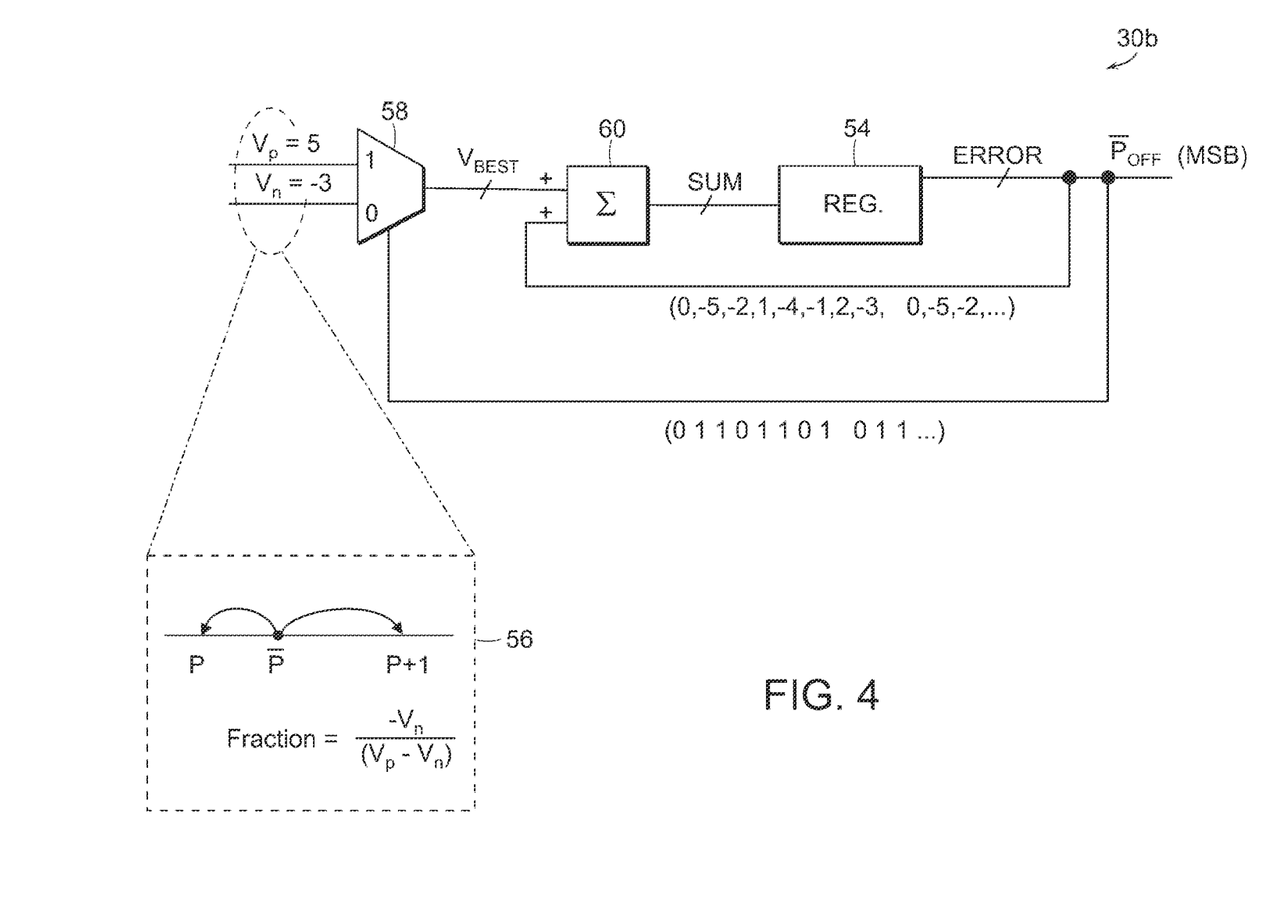
FIG. 4 is a block diagram of the fractional-N pattern generator of FIG. 2, according to yet another example, receiving two vectors $V_p$ and $V_n$ as input, and using only one adder to calculate future error.

FIG. 4 illustrates another modulator 30b. It is different from 30a in many aspects, including the two input integer numbers (being vectors in 30b), the definition of the error and the number of adders in the architecture. In the new modulator, the input integers are two vectors, named positive vector $V_p$ and negative vector $V_n$. The error stored in the register is relative to other reference. One big advantage of this error is that it indicates the correct delta direction, so the future error of the wrong delta direction is not necessary to be calculated, and only one adder is needed. It improves speed and reduces circuit size. The way that the two vectors define the fraction n/d is illustrated at reference numeral 56 in FIG. 4, with the positive vector $V_p$=+5 and the negative vector $V_n$=−3, and the fraction n/d=−$V_n$/($V_p$−$V_n$)=3/8. When the circuit runs, the register (current error) starts with a reset value, for example, 0. The sign bit of the current error indicates the correct delta direction, and also forms the modulated signal $P_{OFF}$ (inverted). It instructs multiplexer 58 to select the appropriate positive or negative vector, and applies the "best" vector $V_{BST}$ to adder 60 as shown. The resulting sum value caused by adding the error value to the best vector is the future error of the correct delta direction. It will update register 54 at each clock cycle. For example, if the $V_p$=+5 and $V_n$=−3, then an error sequence (numeral 72) of 0, −5, −2, 1, −4, −1, 2, −3, . . . and $P_{OFF}$ sequence (numeral 74) 1, 0, 0, 1, 0, 0, 1, 0, . . . will be produced with period of d.

The vector values can be positive or negative, and when in case the fraction n/d is between 0 and 1 they are one positive and one negative, but they can be of other sign combinations if the fraction is in other ranges.

In addition to higher speed and less die area, another advantage of the embodiment of FIG. 4 is higher resolution. Since the vector sign bits are not necessary at the input buses, and the denominator $V_p$−$V_n$ is one bit wider than the input buses. This will result in a half-bit more resolution than the previous modulator 30a for the same input bus width. While the use of vectors in modulator 30b provide higher resolution than modulator 30a, it is recognized that for fractional-N values near an integer number, the pattern of P values will be dominated by that integer with very few P values differing therefrom within the pattern.

Figure 5:
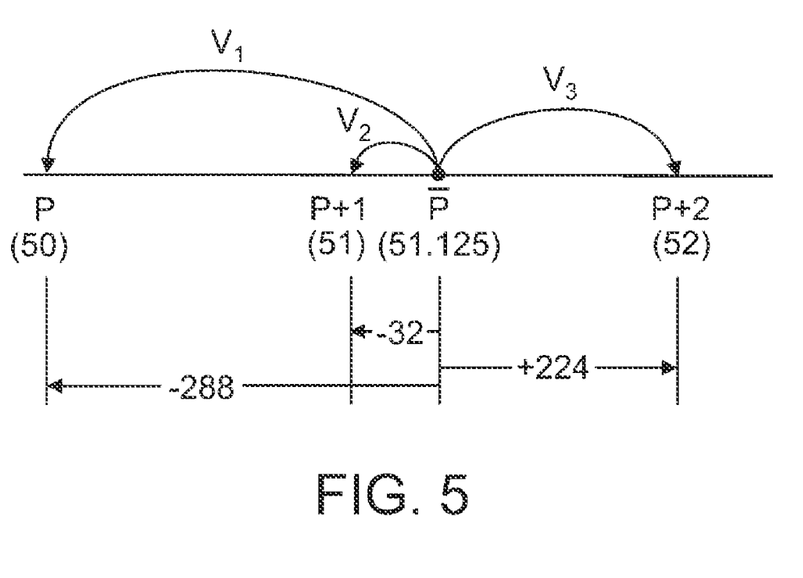
FIG. 5 is a diagram of several vectors, V1, V2, V3, etc. shown extending from the average P derived from a P pattern sequence and used in determining the fractional-N value.

FIG. 5 illustrates an example in which three vectors are shown, rather than the two vectors of FIG. 4. Specifically, two negative vectors at P and P+1 are shown as V1 and V2. One positive vector P+2 is shown as V3. In the example of FIG. 5, a resolution of 256 is chosen between P values (i.e., between P and P+1, and between P+1 and P+2). Each vector is shown extending from the average P value ($\bar{P}$) to the integer P values of P, P+1, and P+2. The amount of vector V1 in a negative direction is cumulative of P average to P+1, and P+1 to P+2. The amount in the example of FIG. 5 between P average and P+1 is −32, and the amount between P+1 and P is −256, making the cumulative amount of vector V1 equal to −288. The amount of vector V2 is shown as −32, and the amount of V3 is 256−32, or +224. It is understood that there can be more than three vectors and the numbers provided for each vector value are merely examples, but serve to illustrate the operation of modulator 30c shown in FIG. 6 in its rudimentary form.

Figure 6:
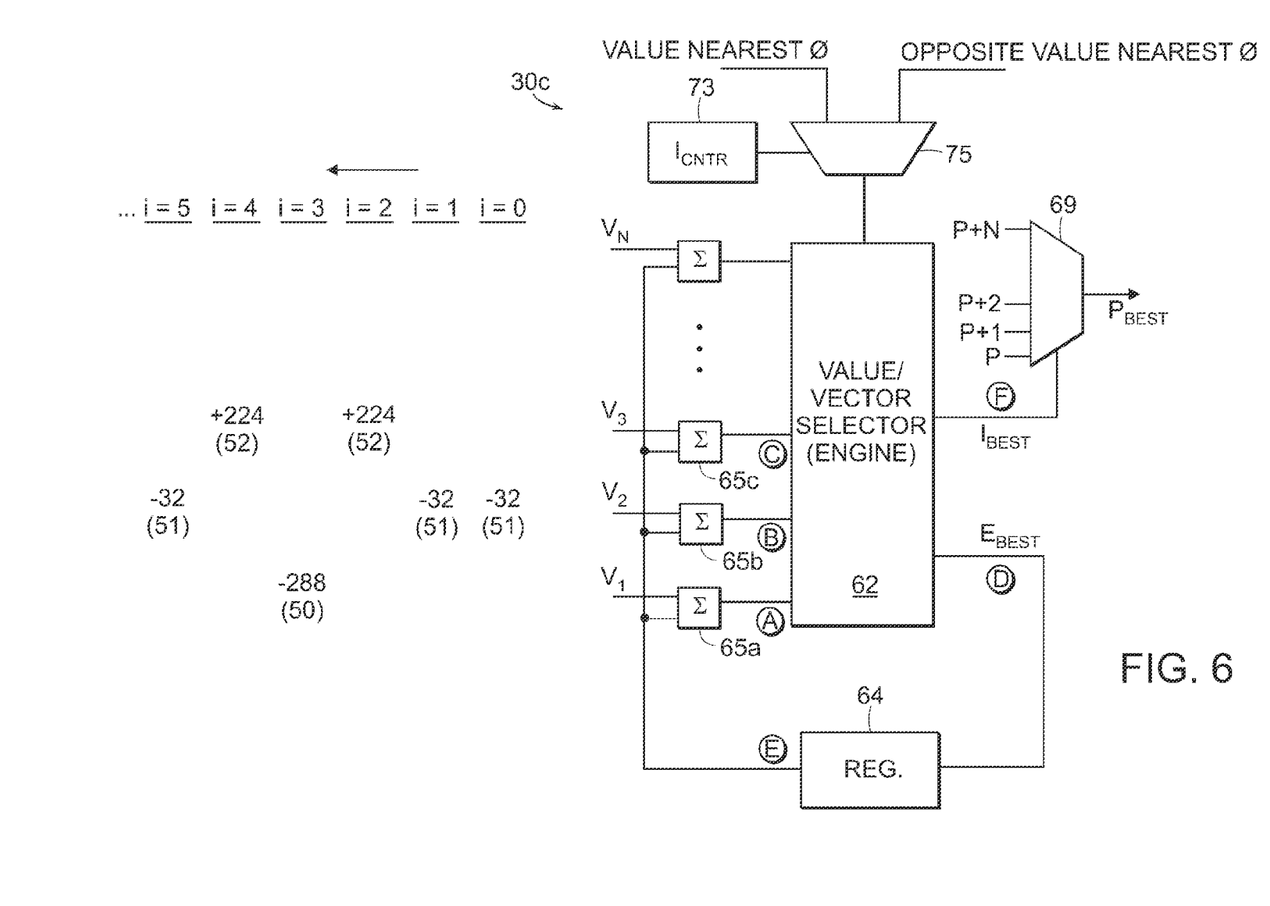
FIG. 6 is a block diagram of the fractional-N pattern generator of FIG. 2, according to yet another example, whereby several vectors are combined with a value from the previously selected, and accumulated, vectors to choose a present vector and a corresponding value within the pattern of values output from the fractional-N pattern generator.
Figure 7:
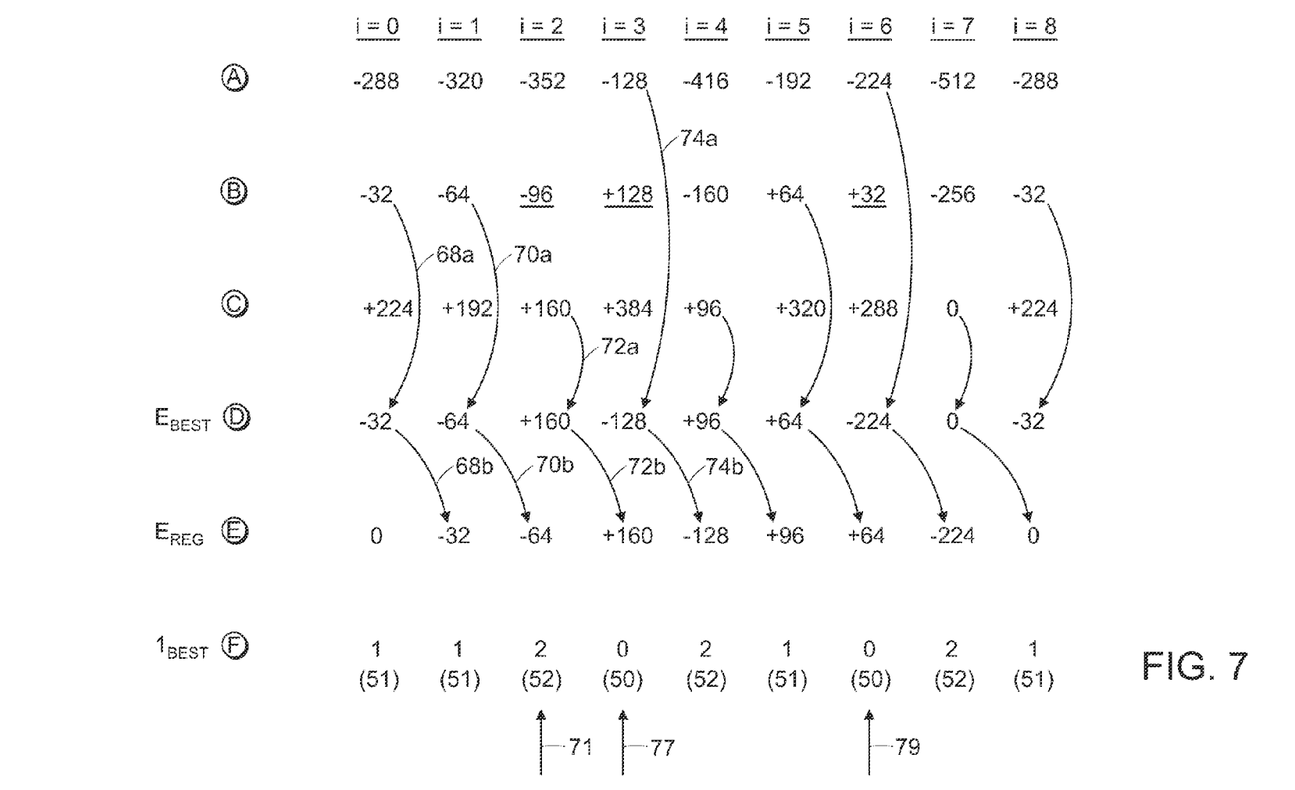
FIG. 7 is a table of various values derived at the nodes shown in FIG. 6 to illustrate an example of a pattern generated from the fractional-N pattern generator.

Turning now to FIG. 6, modulator 30c preferably includes a vector selector engine 62 that iteratively selects amongst a plurality of vectors V1-VN, dependent on which vector when summed with the previously chosen vector produces the best error or closest value nearest a target desired value. There may be N number of vectors; however, the three vectors V1-V3 and their corresponding values are chosen as an example of how the iterative selection process takes place. Referring to FIGS. 6 and 7 in combination, selector engine 62 is reset and the output from register 64 thereby has a 0 value during time i=0. The 0 value is shown at node E in both FIGS. 6 and 7. Vector 0 value is then added to each vector (e.g., vectors V1-V3) by adders 65. Using the numerical examples, adder 65a will yield a sum of −288+0 at node A; adder 65b will yield a sum of −32+0 at node B; and adder 65c will yield a sum of +224+0 at node C. If the target value is one that is nearest to 0, then the sum value of −32 will be chosen at node B and, specifically, vector V2 corresponding to P value of P+1 will be chosen at node F, or $I_{BEST}$.

Thus, the best error or $E_{BEST}$ will equal to −32 at node D that is fed into register 64, and the best P value of P+1 will be selected by the selector node F. In the example shown, P=50, P+1=51, and P+2=52. Thus, at time I=0, $E_{BEST}$ at node D will be the chosen vector of −32 and the chosen P value at selector input node F will be 1, which equates to numeral 51. In the next iteration at time i=1, output from register at node E will be the previously selected and previously stored −32 value as shown by arrows 68*a* and 68*b* (FIG. 7). The −32 previous vector value will be added to each of vectors V1-V3 to yield a sum at nodes A, B and C of −320, −64 and +192, respectively. If the target value is that which is nearest 0, then the summation at node B of −64 will be selected, as shown by arrow 70*a*, and the −64 value will be placed into register 64 as shown by arrow 70*b*. Thus, $E_{BEST}$ at node D will be −64 and the $I_{BEST}$ at node F will be 1. The 1 selector signal is shown fed into multiplexer 69 (FIG. 6) to select P+1 or 51.

At time i=0 as shown by arrow 71 (FIG. 7), the target value might be changed depending on user preferences. A counter 73 ($I_{CNTR}$) (FIG. 6) can be used to change the target value periodically, either at a regular or random basis. For example, every two iterations, the target value is changed or possibly the target can be changed randomly. In the example shown in FIG. 6, the target value can be a value nearest 0 or a value nearest 0 but of opposite sign, each of which are placed into, for example, a selector mechanism, such as a multiplexer 75. Dependent on when the target value is chosen to be changed, either the value nearest 0 or the value nearest 0 but of opposite sign can be fed as an instruction into the selector engine 62. Of course, there may be numerous other mechanisms that can be used besides a multiplexer of counter for setting a target value, changing the target value, or instructing the selector engine of that change in order for the engine to thereafter pick the best target vector value based on that input instruction.

As shown at arrow 71 (FIG. 7), the target value is changed and, instead of selecting the adder output nearest 0 which would be at node B (−96), engine 62 selects a value of opposite sign from the previously selected vector (i.e., −32) and thereby selects +160 at the output of node C. Among the positive vectors, node C is the value closest to 0 and, therefore, is selected as shown by arrow 72*a*. That selection is then fed into the register in readiness for the next iterative selection as shown by arrow 72*b*. The main advantage of changing the target value is to increase the modulation amounts, and to force node F selection signal to be of greater magnitude in the opposite sign value. As shown, node F has a value of 2 commensurate with vector V3 chosen at node C and pointing to P value of P+2 or 52. Thus, instead of having a sequence of 111, the P sequence output from multiplexer 69 is 112.

As shown by arrow 77, the selector engine may then select at time i=3 a vector value nearest 0, but of opposite sign, than the previously selected vector at time i=2 (i.e., vector+160 at time i=2). The vector selected at time i=3 must, therefore, be a negative vector nearest 0 or vector V1, which yields a −128 when added to +160. Summation amount −128 is selected as shown by arrow 74*a* and is placed into the register for the next iteration as shown by arrow 74*b*. Since the vector which produces the sum output at node A is vector V1 with a value of 50, $I_{BEST}$ signal at node F is a 0 value in order to select the P value of 50.

The process shown in FIG. 7 continues with arrow 79 used to indicate a different selection or target value mechanism by which the opposite sign value nearest 0 is chosen at time i=6. However, at all other times i=4, i=5, i=7, and i=8, the vector chosen is that which is closest to 0 as evidenced from the arrows shown in FIG. 7. Each time a vector is selected, the P value will be output as the $P_{BEST}$ value from multiplexer 69 and placed into the sequential pattern fed to the divider of the frequency synthesizer. As the pattern continues, an average P value can be determined, and that average in the example shown is 51.125. However, by periodically increasing the modulation amounts in the positive and negative directions, the frequency of change is increased. Nonetheless, that frequency of change can be easily filtered by the low-pass filter within the PLL. The higher frequency of change is needed in order to allow the low-pass filter to eliminate the unwanted low frequency jitter associated with the prior embodiments shown in FIGS. 3 and 4. That jitter is prevalent whenever the average P value is near an integer number, as would be the case in the example shown in FIG. 5, where the average P value is 51.125 and, thus, near the P value of P+1=51.

Modulators and divider controllers in the embodiments above may be directly used in a frequency synthesizer to achieve non-integer N frequency synthesis. It is also useful in other applications where such modulated pattern is needed. Furthermore, the improved circuit and method may be used in applications such as spread spectrum modulation, communication signal encryption, or other applications that track digital signals. This is done by modulating one or more digital signals into one or more signals in the fractional-N control logic circuit architecture of modulator 30.

In a preferred embodiment, more than two vectors, or more than a single positive vector and a single negative vector are used. Each vector has a magnitude and a direction, and is associated with a P value. Thus, the vector from average P value to P+2 might be equal to +224, however, the vector of +224 is associated with the P+2 value of 52. In the vector space, the consecutive P values are spaced from each other with fairly high resolution and, thus, can be spaced fairly near to each other with somewhat small magnitude differences. Any integer P value is expressed by the step difference from the average P to that particular integer P value and, thus, is expressed as a vector.

The modulation circuit 30*c* comprises register 64 to store the current error, which is proportional to the phase error. There are adders 65 used to calculate future errors or the next modulation step associated with each vector. The best vector selection logic 62 can be any programmable state machine or a programmable engine that decides which future error is the best for modulation. Different selection algorithms can be implemented in order to determine the target value of the, for example, delta-sigma modulation output. When the best vector is decided, the future error associated with that vector is stored as the current error, and the associated P value is also selected by the multiplexer 69. Modulator 30*c* is preferable over a two vector solution shown in FIG. 4, and also preferable over the fractional vector solution shown in FIG. 3. Modulator 30*c* can be made with fairly low cost logic circuitry and is flexible for a programmable clock.

Modulators in the embodiments above can also be extended to high order delta-sigma logic by adding more stages, add appropriate feedback and feedforward between stages, and (or) cascading the stages with possibly a digital decimation filter therebetween to remove the oversampling noise of the delta-sigma modulator. To improve the speed, pipelines may be added in many of the modulator architectures in many places, for example in the adder and between stages of high order architecture.

The various circuit features set forth in the present disclosure are not to be interpreted as reflecting all possible features of the claimed invention. The specification and drawings are, therefore, to be regarded in an illustrative rather than a restrictive sense.

What is claimed is:

1. A modulator circuit for producing a sequential pattern of values modulated about an average value, comprising:
   a plurality of adders coupled to sum a present set of values with one value applied to each of the plurality of adders, and calculated from a preceding set of values within the sequential pattern of values; and a selector logic for selecting one of the present set of values.

2. The modulator circuit as recited in claim 1, wherein the selector logic comprises a set of inputs for receiving output from each of the plurality of adders and for selecting the present set of values based on the sum being compared to a pre-determined target value.

3. The modulator circuit as recited in claim 1, wherein the selector logic selects one of the present set of values if the sum is nearest zero in value or if the sum is nearest zero in value but is of opposite sign than the value chosen from the preceding set of vector values.

4. The modulator circuit as recited in claim 1, wherein the average value is a fraction.

5. The modulator circuit as recited in claim 1, wherein each of the present set of values is a vector extending from a fractional value to an integer value exceeding or less than the fractional value.

6. The modulator circuit as recited in claim 1, further comprising a multiplexer means coupled to receive from the selector logic a selection signal upon a selector input of the multiplexer means, wherein the selection signal is used to select in sequence the sequential pattern of values.

7. The modulator circuit as recited in claim 1, further comprising a multiplexer means coupled to periodically forward instructions to the selector logic for selecting the sum nearest zero in value but is of opposite sign than the value chosen from the preceding set of potential values, but otherwise selects the sum nearest zero.

8. The modulator circuit as recited in claim 7, wherein the multiplexer means periodically forwards instructions in random order.

9. The modulator circuit as recited in claim 7, the multiplexer means periodically forwards instructions at regular intervals.

10. A circuit for producing a signal of selectable frequency, comprising:
   a modulator;
   a phase-locked loop coupled to the modulator and having a divider that fractionally divides a frequency of the signal based on a plurality of integer values extending as positive and negative vector values from an average value equal to a fraction by which the divider divides the frequency of the signal;
   a plurality of adders coupled to sum a present set of potential vectors with an immediately preceding vector chosen from a preceding set of potential vectors; and
   a selector logic for choosing one from among the present set of potential vectors if the sum is nearest zero in value.

11. The circuit as recited in claim 10, wherein the fraction is a mixed number.

12. The circuit as recited in claim 10, wherein the selector logic further chooses one from among a future set of potential vectors if a sum of the future set of potential vectors and the present vector chosen from the present set of potential vectors is nearest zero in value but is of opposite sign than the value chosen from the present set of potential values.

13. The circuit as recited in claim 10, further comprising a multiplexer coupled to receive from the selector logic a selection signal upon a selector input of the multiplexer, wherein the selection signal is used to select in sequence the sequential pattern of values.

14. The circuit as recited in claim 12, further comprising a multiplexer coupled to periodically forward instructions to the selector logic for selecting the sum nearest zero in value but is of opposite sign than the value chosen from the preceding set of potential values, but otherwise selects the sum nearest zero.

15. The circuit as recited in claim 14, wherein the multiplexer periodically forwards instructions in random order or instructions at regular intervals.

16. A method of modifying a frequency of a signal, comprising:
   selecting a vector from among a plurality of vectors having a sum when added with a value calculated from a previous vector within a sequence of vectors that is near a target value of zero or near a target value of zero, but of opposite sign than the previous vector;
   repeating the selecting step for selecting a sequence of vectors; and
   using the sequence of vectors to correspondingly change a divider value within a phase-locked loop to modify a frequency of the signal applied to the phase-locked loop.

17. The method as recited in claim 16, wherein said selecting comprises periodically setting the target value nearest zero and, interspersed in sequence therewith, periodically setting the target value nearest zero but of opposite sign than the previous vector.

18. The method as recited in claim 16, wherein said repeating the selecting step comprises applying the sequence of vectors to change in succession the divider value such that over a pre-existing number of vectors the divider value comprises a fraction.

* * * * *